United States Patent [19]

Bae

[11] Patent Number: 5,668,381

[45] Date of Patent: Sep. 16, 1997

[54] THIN FILM TRANSISTOR ARRAY PANEL FOR A LIQUID CRYSTAL DISPLAY

[75] Inventor: Byung Seong Bae, Kyungki-do, Rep. of Korea

[73] Assignee: Samsung Electronics Co., Ltd., Suwon, Rep. of Korea

[21] Appl. No.: 670,031

[22] Filed: Jun. 25, 1996

Related U.S. Application Data

[63] Continuation of Ser. No. 350,003, Nov. 29, 1994, abandoned.

[30] Foreign Application Priority Data

Nov. 29, 1993 [KR] Rep. of Korea .................. 93-25705

[51] Int. Cl.$^6$ .................. H01L 29/04; H01L 29/417
[52] U.S. Cl. .................. 257/72; 257/66
[58] Field of Search .................. 257/72, 66, 67, 257/69, 59, 57, 351; 359/59

[56] References Cited

U.S. PATENT DOCUMENTS 3,749,614  7/1973  Boleky, III et al. .................. 257/351
5,323,042  6/1994  Matsumoto .................. 257/350

OTHER PUBLICATIONS

Enhanced Polysilicon Thin–Film transistor Performance By Oxide Encapsulation, by John R. Troxell and Marie I. Harrington, J. Electrochem Soc., vol. 138, No. 3, Mar. 1991.

*Primary Examiner*—Jerome Jackson
*Assistant Examiner*—John Guay
*Attorney, Agent, or Firm*—William L. Geary, Jr.

[57] ABSTRACT

A thin film transistor formed in a liquid crystal display, comprising; a silicon layer formed over a transparent substrate, a first insulating layer formed over the silicon layer, a gate electrode and a plurality of gate line electrodes formed on the first insulating layer, a second insulating layer formed over the gate electrode and the gate line electrodes having a plurality of contact holes, and a metal line ohmically connected to the gate electrode and the plurality of gate line electrodes through the plurality of contact holes.

9 Claims, 6 Drawing Sheets

THIN FILM TRANSISTOR ARRAY PANEL FOR A LIQUID CRYSTAL DISPLAY

This is a continuation of application Ser. No.: 08/350,003, filed on Nov. 29, 1994, which was abandoned upon the filing hereof.

BACKGROUND OF THE INVENTION

1. Field of the Invention

The present invention relates to liquid crystal display panels. More particularly, the present invention relates to thin film transistors (TFTs) and a method for making thin film transistors having a gate electrode and gate line electrodes connected by means of a metal line in a thin film transistor formed of polysilicon.

2. Description of the Prior Art

As contemporary image display devices, such as high definition television sets, have been developed, flat panel display devices have been much in demand. The liquid crystal display is representative of techniques used to make flat panel display devices. The liquid crystal display (LCD) contributes a combination of colorgenic features, low power consumption, and high speed performance that electroluminescence devices (EL), vacuum fluorescence displays (VFD), plasma display panels (PDP), etc., have failed to attain.

An LCD device may be characterized as an active device, or a passive device. The active device is superior to the passive device in performance speed, and in view angle and contrast readability. Thus, the active LCD device has been identified as being the most appropriate display device for high definition television sets which require resolution of more than one million pixels. As the importance of thin film transistors has been recognized in future commercial products, research activities directed TFTs have increased.

Research in the field of thin film transistors, which serve as electrical switches for selective driving of pixel electrodes in the liquid crystal display devices, has focused on improvements in the structure of the transistors, in the performance characteristics of the amorphous or polycrystalline silicon, and in the prevention of ohmic contact failures, opens and shorts, in the TFT electrodes. Each of these improvements ultimately enhances production yield.

Polycrystalline silicon thin film transistors are favorite elements used to form switching devices and peripheral driving circuits in liquid crystal display panels. Accordingly, a great deal of research has recently been devoted to thin film transistors for large scale LCDs which can be mass produced at low cost.

The most common materials used to form the substrate in a liquid crystal display panel is transparent glass produced in a low temperature fabrication process, and quartz produced in a high temperature fabrication process.

The steps of a conventional method used to manufacture a thin film transistor in a liquid crystal display panel are illustrated in FIGS. 1A to FIGS. 1F.

As shown in FIG. 1A, the formation of a conventional thin film transistor begins with depositing a silicon layer 12 on a transparent substrate 10. The silicon layer 12 is patterned, and an insulating layer 14 is deposited to overlay the upper surface of silicon pattern 12 and to surround both sides of silicon pattern 12, as shown in FIG. 1B.

Insulating layer 14, typically an oxide layer, may be grown in an ambient atmosphere of oxygen, or may be grown by a chemical vapor deposition.

Subsequently, a polycrystalline silicon layer 16 is deposited over the surface of substrate 10 on which the silicon pattern 12 is formed, as shown in FIG. 1C, and silicon layer 12 is doped by means of $POCL_3$ to lower it ohmic resistance. Subsequently, as shown in FIG. 1D, a gate pattern 16 is formed from the polycrystalline silicon layer, and ion implantation is performed.

As a result, ion implantation to form active drain/source regions is made into the entire upper surface of the resulting structure, except the region underlying gate electrode 16. An isolation oxide layer 18 is then deposited over the upper surface of the substrate on which the pattern is formed as shown in FIG. 1E. In order to achieve subsequent planarization of this layer, a borophosphosilicate glass (BPSG) may be used.

Activation of the implanted ions is carried out at a temperature of more than 800° C. After that, contact holes are selectively formed through isolation oxide layer 18, as shown in FIG. 1F, and a metal layer 20 is deposited to a predetermined thickness over and adjacent to the contact holes to form the source/drain electrodes, whereby the formation of a polycrystalline silicon, thin film transistor is completed. In order to reduce off current, the foregoing structure having light doped drain (LDD) may be used.

FIG. 2 depicts a top plan view of the conventional thin film transistor for use in a liquid crystal display device. Reference numerals designate the following parts: 12 a silicon pattern; 22 a contact; 23 a gate. A sectional view of the gate taken along lines A–A' has a structure appearing in FIG. 1C.

In a case where the cross-sectional view of the gate has the structure shown in FIG. 1C, a "weak point," exists within this structure, as denoted by II in FIG. 1C, which increases leakage current and degrades overall reliability of the TFT.

A 1991 article in the Journal of Electrochemical Society, Issue 138, page 802 discloses the structure of the weak point. FIGS. 3A through 3C illustrate the teachings of this article. In FIG. 3A, a silicon layer 12 is deposited over a transparent substrate 10, and an oxide layer 14 of $SiO_2$ and a silicon nitride layer 17 are serially deposited over silicon layer 12. The oxide layer and silicon nitride layer are patterned into islands by means of a photoresist pattern.

The photoresist pattern is removed and thermally oxidized to form the oxide layer 14 shown in FIG. 3B. After the oxide layer 14 has been formed, the silicon nitride layer is removed. A gate layer 16 is deposited on the pattern of FIG. 3B to remove the weak point appearing in the conventional TFT.

U.S. Pat. No. 5,120,667 discloses a technique for forming a TFT having reduced leakage current and a simplified fabrication process. This technique is illustrated in FIGS. 4A to 4D.

To explain the above fabrication process briefly, a silicon layer 12, a thermal oxide layer 14 (or an oxide layer) and a gate polysilicon layer 16 overlay one another on a transparent substrate 10. The gate polysilicon layer 16 is doped and patterned into islands so as to form the structure shown in FIG. 4A. The insulating layer 19 is applied to the resulting substrate, as shown in FIG. 4B.

After that, the insulating layer 19 is etched by a reactive ion etching to reduce the insulating layer 19 to twin side walls covering both sides of oxide layer 14, as shown in FIG. 4C. A polysilicon layer 21 is deposited over the resulting substrate to yield the structure of FIG. 4D.

According to the above fabrication process, a silicon pattern is formed then patterned, an oxide layer is deposited, and an insulating layer is formed into side walls in order to prevent the side edges of the patterned silicon from being exposed.

SUMMARY OF THE INVENTION

The present invention is made in consideration of the above-mentioned problems.

It is an object of the present invention to provide thin film transistors for a liquid crystal display device and a method for making the thin film transistors which simplifies the fabrication process while preventing leakage current.

In order to achieve the above object, the inventive method for making thin film transistors for a liquid crystal display, comprises the steps of:

forming serially a silicon layer, a first insulating layer and a gate polysilicon layer to a predetermined thickness on a transparent substrate;

forming gate lines after doping phosphorus on the gate polysilicon layer and then performing ion-implantation;

applying a photoresist layer on the substrate including the gate lines to pattern the silicon layer into islands and etching the gate lines to form a gate electrode and gate lines to be with each space being of a predetermined width;

forming second insulating layers for separation of electrode lines on the substrate having the silicon patterns;

forming contact holes on the gate electrode, gate lines and silicon patterns; and forming a metal lines so as to connect the gate electrode to the gate lines through the contact holes, simultaneously with forming a source-drain electrode on the contact holes.

As another aspect of the present invention, the inventive thin film transistor comprises:

a gate electrode formed on a transparent substrate;

gate lines formed to be separated from the gate electrode with a predetermined space;

silicon patterns formed to be cross the gate electrode and gate lines around the gate electrode;

contact holes formed on the gate electrode, gate lines and silicon patterns;

metal lines formed to have a narrower width than the gate lines on the gate electrode and gate lines so as to connect the gate electrode to the gate lines; and a source/drain metal electrode connected to the source/drain contact holes.

Simplification of the fabrication process, and reliability of the resulting LCD may be ensured using the present invention.

BRIEF DESCRIPTION OF THE DRAWINGS

FIG. 5A is a sectional view showing that a silicon layer is deposited on a substrate;

FIG. 5B is a sectional view showing that a gate polysilicon layer is formed on an insulating layer;

FIGS. 5C-1 to 5C-2 are respectively a sectional view and a plan view showing that a gate pattern is formed on the insulating layer;

DETAILED DESCRIPTION OF THE PREFERRED EMBODIMENTS

Preferred embodiments of the present invention will now be described in detail with reference to the accompanying drawings.

Figure 2:
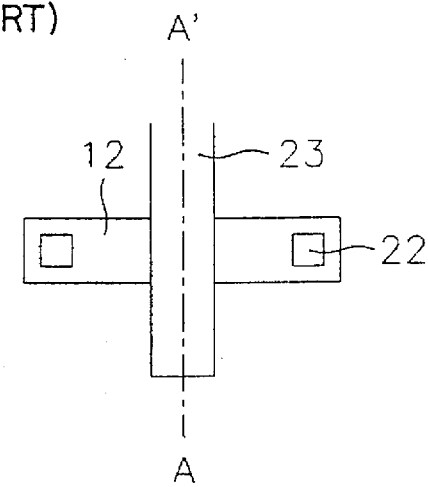
FIG. 2 is a plan view showing a structure of the thin film transistor for a liquid crystal display device in FIGS. 1A to 1F.
Figure 3A:
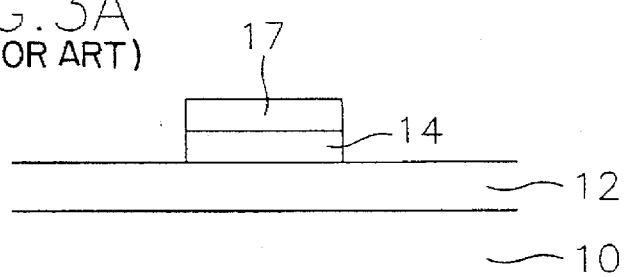
FIGS. 3A to 3C depict the conventional steps in the manufacture of a thin film transistor to prevent the leakage current caused in the silicon and gate of the thin film transistor.
Figure 3B:
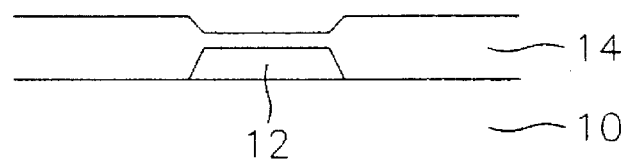
Figure 3C:
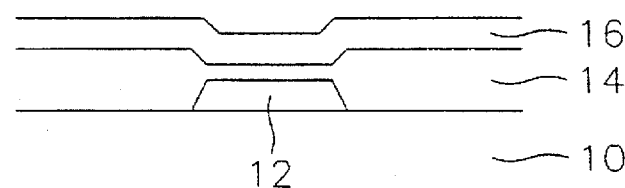
Figure 4A:
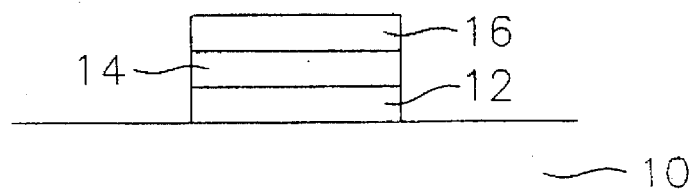
FIGS. 4A to 4D, depict a technique for forming a TFT as disclosed in U.S. Pat. No. 5,120,667.
Figure 4B:
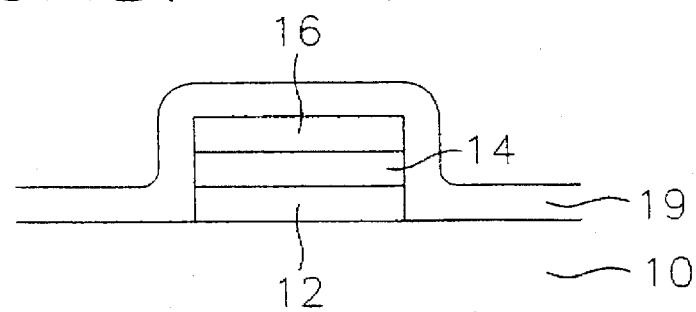
Figure 4C:
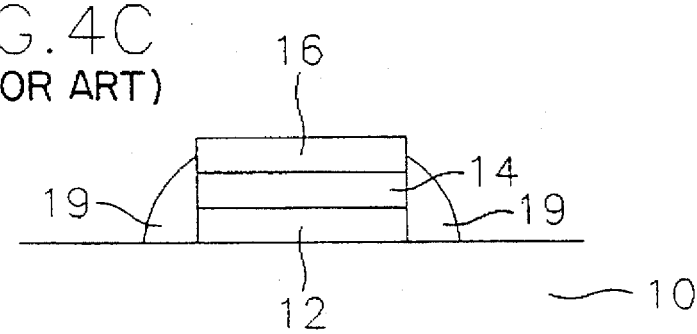
Figure 4D:
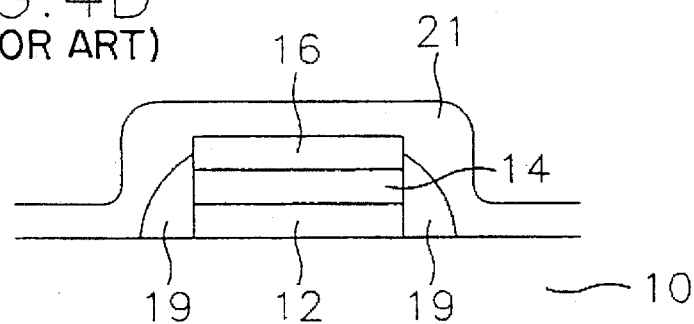
Figure 5A:
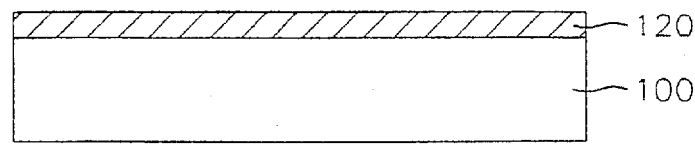
FIG. 5A to 5C depict the steps in the manufacture of a thin film transistor for a liquid crystal display device in accordance with the present invention.
Figure 5B:
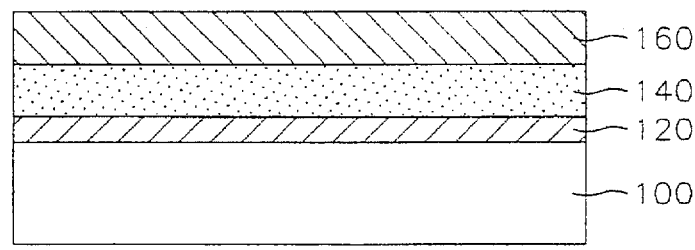
Figures 1, 5C:
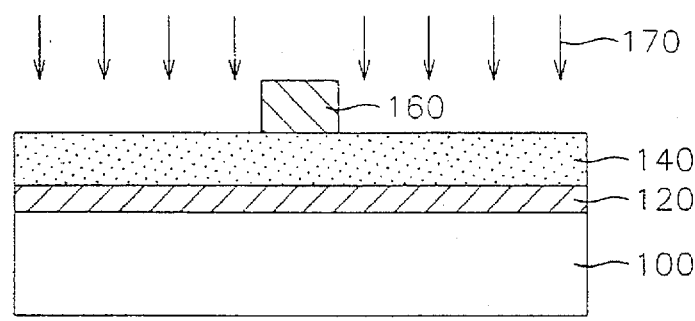
Figures 2, 5C:
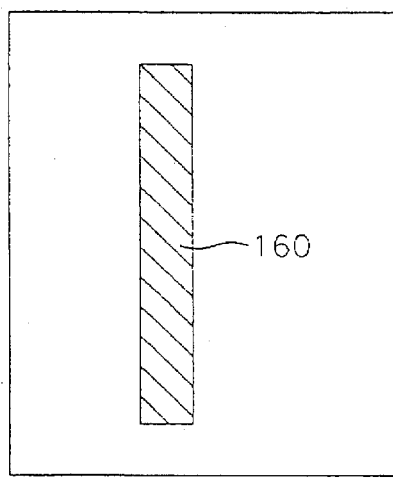

FIGS. 5A to 5C (inclusive of FIGS. 5C-1 and 5C-2) depict the steps in the manufacture of a thin film transistor for a liquid crystal display device in accordance with the present invention. FIG. 5A is a sectional view showing a silicon layer 120 deposited on a substrate 100; FIG. 5B is a sectional view showing a gate polysilicon layer 160 formed over an insulating layer 140, and FIGS. 5C-1 and 5C-2 are, respectively, a sectional view and a plan view showing that a gate pattern 160 formed on insulating layer 140.

In the first step of the method of manufacturing according to the present invention, a silicon layer 120 is formed on a glass substrate 100 as shown in FIG. 5A. The silicon layer is formed to a thickness of about 800 to 1000 angstroms, but the thickness may be varied according to various design objectives.

Next, a first insulating layer 140 and a gate polysilicon layer 160 are serially formed over silicon layer 120 as shown in FIG. 5B, and the gate polysilicon layer is patterned into islands which form the gate electrode 160 shown in FIG. 5C-1.

Ion implantation is performed (170) on the pattern where the gate electrode is formed, as shown in FIG. 5C-1. FIG. 5C-2 shows a plan view of the pattern. The first insulating layer 140 is formed to a thickness of 500 to 1000 angstroms, and in the case of a high temperature fabrication process, a thermal oxide layer is thermally treated in an ambient atmosphere of oxygen. In the case of a lower temperature fabrication process, the thermal oxide layer is formed by a photo-etching chemical vapor deposition method, or by a low temperature deposition. After the deposition of the silicon layer 120, the oxide layer 140 is formed to reduce impurities.

After the gate polysilicon layer has been deposited, the ion-implantation or doping with phosphorous with $POCL_3$ is performed to reduce resistance.

Figure 6:
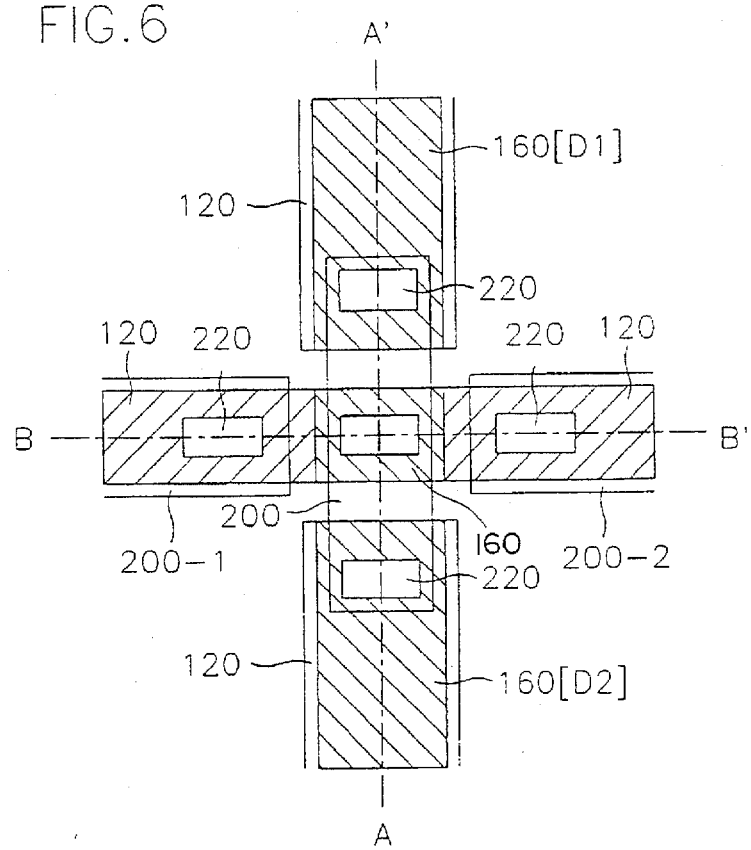
FIG. 6 is a plan view showing the pattern of the completed thin film transistor for a liquid crystal display device.

In order to form the thin film transistor as shown in FIG. 6, photoresist (not shown) is applied to the foregoing structure overlaying substrate 100 to pattern silicon layer 120 into islands. At this point, the gate electrode 160 is etched to have the shape shown in the plan view of FIG. 6, wherein gate line electrodes 160[$D_1$] and 160[$D_2$] are each formed with a space of predetermined width between the respective gate line electrodes 160[$D_1$] and 160[$D_2$] and gate electrode 160.

The silicon layer 120 is patterned by reactive ion etching, and use of the photoresist which has been selectively applied to form the desired gate electrode pattern.

A second insulating layer 240 which separates the gate line electrode structure is deposited to a thickness of about 4000 to 6000 angstroms, or to a predetermined thickness on the surface of the resulting structure formed over substrate 100 where the pattern is formed, and the injected ion is activated.

As shown in FIG. 6, contact holes 220 are formed and a metal line 200 is formed through contact holes 220 so as to electrically connect the gate electrode 160 and gate line electrodes 160[$D_1$] and 160[$D_2$].

The source-drain metal electrodes 200-1 and 200-2 formed on the contact holes located on either side of the gate electrodes.

The thin film transistor formed through the above process, includes gate electrode 160 formed over transparent substrate 100; the gate line electrodes 160[$D_1$] and 160[$D_2$] formed on either side of gate electrode 160, each having a space of a predetermined width between itself and gate electrode 160; the silicon layer 120 patterned to be orthogonal to gate electrode 160; contact holes 220 formed through to gate electrode 160 and a gate line electrodes 160[$D_1$] and 160[$D_2$] and patterned silicon layer 120; wherein metal lines 200 and source-drain electrode are formed to have a width narrower than the gate line electrodes 160[$D_1$] and 160[$D_2$] so as to connect the gate electrode to the gate line electrodes.

Figure 7:
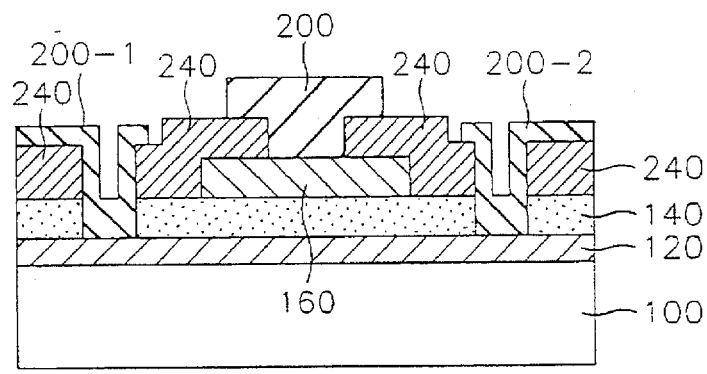
FIG. 7 is a sectional view taken along lines B–B' of FIG. 6.

As taken along line B–B' in FIG. 6, the silicon layer 120 formed over transparent substrate 100, as shown in FIG. 7. First insulating layer 140 is formed over silicon layer 120. The gate electrode 160 is formed on first insulating layer 140 and second insulating layer 240 is formed over first insulating layer 140. When formed the upper surface of and the side surfaces of gate electrode 160 are exposed.

Metal line 200 is formed on second insulating layers 240 to be narrower than the gate electrode 160. The source 200-1 and drain 200-2 metal electrode is formed through the source-drain contact hole.

Figure 8:
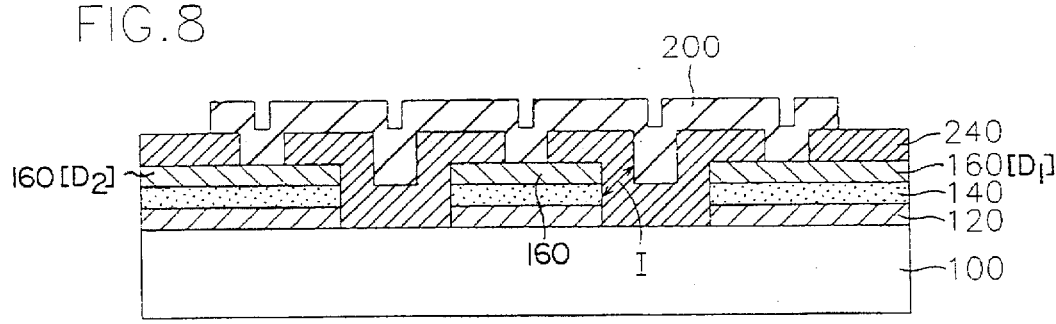
FIG. 8 is a sectional view taken along lines A–A' of FIG. 6.

As taken along lines A–A' of FIG. 6, silicon layer 120 is formed over transparent substrate 100 and patterned into islands separated from each other by a predetermined space, as shown in FIG. 8. First insulating layer 140 is formed over silicon layer 120 and patterned with silicon layer 120. Gate electrode 160 is formed on first insulating layer 140. Second insulating layer 240 is formed over the resulting structure overlaying transparent substrate 100. Metal line 200 is formed to have a predetermined thickness on second insulating layers 240.

Figure 1A:
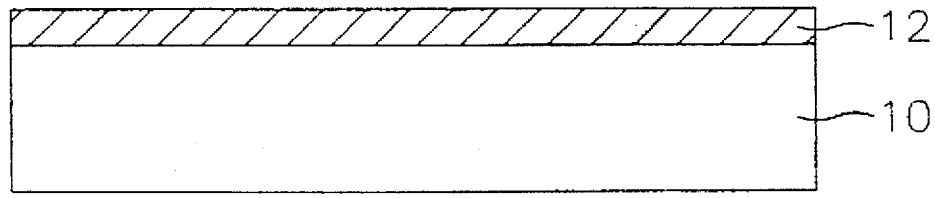
FIGS. 1A to 1F depict the steps in the manufacture of a thin film transistor for liquid crystal display device in accordance with a conventional art.
Figure 1B:
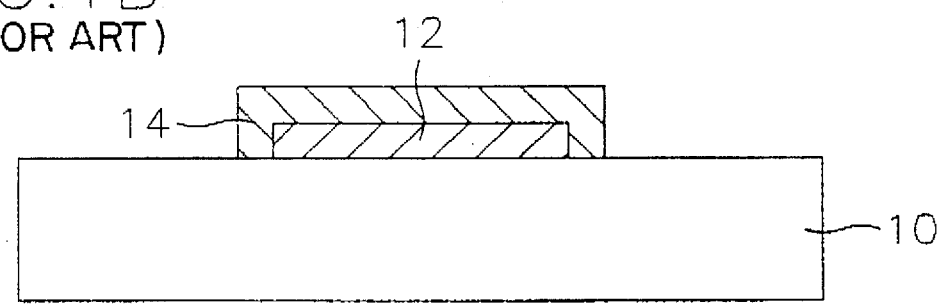
Figure 1C:
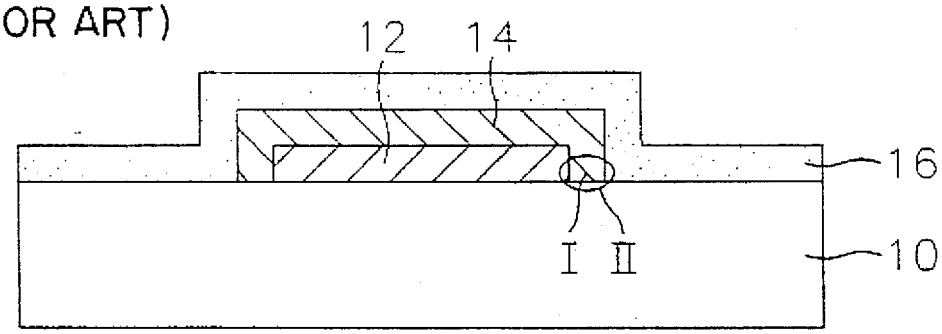
Figure 1D:
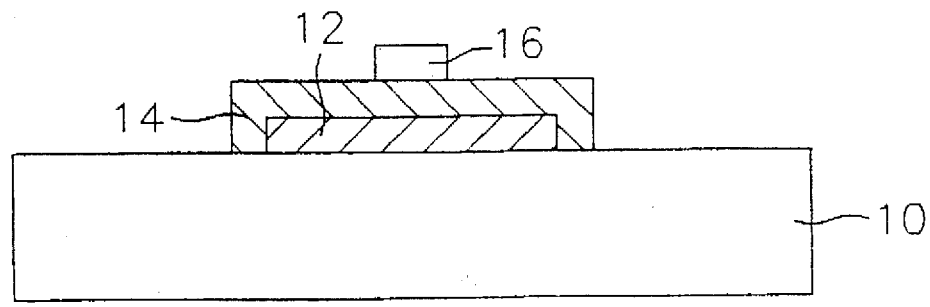
Figure 1E:
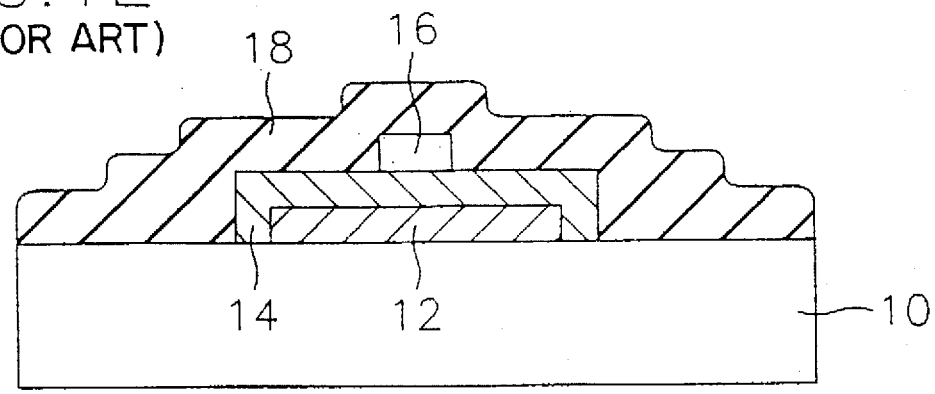
Figure 1F:
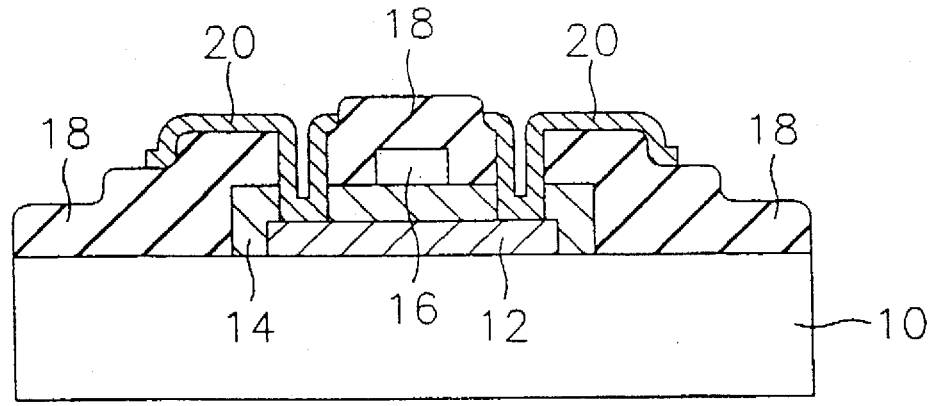

When it comes to comparing the sectional view of FIG. 8 and the conventional one of FIG. 1C, a point I indicated in FIG. 8 is wider than the point I indicated in FIG. 1C. That is, the thickness I of the insulating layer of FIG. 1C is about 1000 angstroms, and the thickness I of the insulating layer of FIG. 8, may be formed to be about 6000 angstroms. This may solve the problem of deterioration in the performance characteristics of the associated transistors, and increase production yield, since failures due to excessive leakage current may be avoided.

According to the present invention, the oxide layer is formed right after the deposition of the silicon to reduce impurities and is formed in such a manner as it alleviates problems caused by leakage current in the conventional transistor structure. Moreover, simplification of the manufacturing process, and improved reliability of the resulting LCD may be obtained by use of the present invention.

What is claimed is:

1. A thin film transistor array panel of a liquid crystal display having a plurality of transistors, comprising:

a transparent substrate;

a plurality of coplanar silicon regions formed over the substrate, each silicon region having a source and a drain region;

a first insulating layer formed over the silicon regions, said first insulating layer having a first thickness;

a plurality of gate electrodes, each gate electrode formed on the first insulating layer above each silicon region;

a plurality of gate line electrodes formed on the first insulating layer from the same conductive layer as the gate electrodes, the gate line electrodes having a first width, wherein each said gate electrode is positioned between two associated said gate line electrodes, and each said gate electrode is separated by a predetermined distance from each of said two associated gate line electrodes;

a second insulating layer having a second thickness, formed over the gate electrodes and the gate line electrodes, having a plurality of first contact holes to expose respective portions of the gate electrodes and the gate line electrodes; and a plurality of metal lines formed over the second insulating layer, having a second width, wherein each metal line is ohmically connected to one of the gate electrodes and said two associated gate line electrodes through the first contact holes.

2. The thin film transistor array panel of claim 1, wherein the first width of each gate line electrode is larger than the second width of each metal line.

3. The thin film transistor array panel of claim 1, wherein the second insulating layer further has a plurality of second contact holes to expose respective portions of the source and the drain regions, and further comprising a plurality of metal source and drain electrodes formed on the second insulating layer from the same conductive layer as the metal lines.

4. The thin film transistor array panel of claim 1, wherein said second thickness is greater than said first thickness.

5. The thin film transistor array panel of claim 4, wherein said second thickness is greater than about 3000 angstroms.

6. The thin film transistor array panel of claim 4, wherein said second thickness is greater than about 5000 angstroms.

7. The thin film transistor army panel of claim 1, wherein said gate electrodes and gate line electrodes are polysilicon.

8. The thin film transistor array panel of claim 1, wherein said predetermined distance is greater than about 3000 angstroms.

9. The thin film transistor array panel of claim 1, wherein said predetermined distance is greater than about 5000 angstrom.

* * * * *